United States Patent
Ueno et al.

(10) Patent No.: US 7,020,953 B2
(45) Date of Patent: Apr. 4, 2006

(54) APPARATUS AND METHOD FOR MOUNTING COMPONENT

(75) Inventors: Yasuharu Ueno, Osaka (JP); Shozo Minamitani, Ibaraki (JP); Shinji Kanayama, Kashihara (JP); Satoshi Shida, Hirakata (JP); Shunji Onobori, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 172 days.

(21) Appl. No.: 10/239,060

(22) PCT Filed: Mar. 23, 2001

(86) PCT No.: PCT/JP01/02308
§ 371 (c)(1),
(2), (4) Date: Dec. 5, 2002

(87) PCT Pub. No.: WO01/72097
PCT Pub. Date: Sep. 27, 2001

(65) Prior Publication Data
US 2004/0020043 A1 Feb. 5, 2004

(30) Foreign Application Priority Data
Mar. 23, 2000 (JP) .................................... 2000-082263

(51) Int. Cl.
*B23P 19/00* (2006.01)

(52) U.S. Cl. .................. 29/740; 29/739; 29/833
(58) Field of Classification Search ............ 29/739, 29/740, 825, 832, 833, 33 M
See application file for complete search history.

(56) References Cited

U.S. PATENT DOCUMENTS

| | | | | |
|---|---|---|---|---|
| 4,881,319 A | * | 11/1989 | Yagi et al. .................. | 29/840 |
| 5,040,291 A | * | 8/1991 | Janisiewicz et al. ........ | 29/840 |
| 5,203,061 A | * | 4/1993 | Hamada ...................... | 29/33 M |
| 5,342,460 A | * | 8/1994 | Hidese ........................ | 156/64 |
| 5,491,888 A | * | 2/1996 | Sakurai et al. .............. | 29/832 |
| 5,566,447 A | * | 10/1996 | Sakurai ....................... | 29/832 |
| 5,855,059 A | * | 1/1999 | Togami et al. .............. | 29/740 |
| 5,862,586 A | * | 1/1999 | Kimura ....................... | 29/832 |
| 5,894,657 A | * | 4/1999 | Kanayama et al. .......... | 29/740 |

FOREIGN PATENT DOCUMENTS

| JP | 2-56944 | 2/1990 |
|---|---|---|
| WO | 99 43192 | 8/1999 |

* cited by examiner

*Primary Examiner*—Carl J. Arbes
(74) *Attorney, Agent, or Firm*—Wenderoth, Lind & Ponack, L.L.P.

(57) ABSTRACT

A component mounting system includes first to third (pickup, transfer, and placement) stations. A component supplied at a component supply is picked up by a transport head at the pickup station and then transferred to a placement head at the transfer station. The placement head carries the component to the placement station where the component is placed and mounted onto a substrate such as a circuit board. The component, when held by the placement head, is recognized by an imaging device at or in the vicinity of the transfer station.

10 Claims, 14 Drawing Sheets

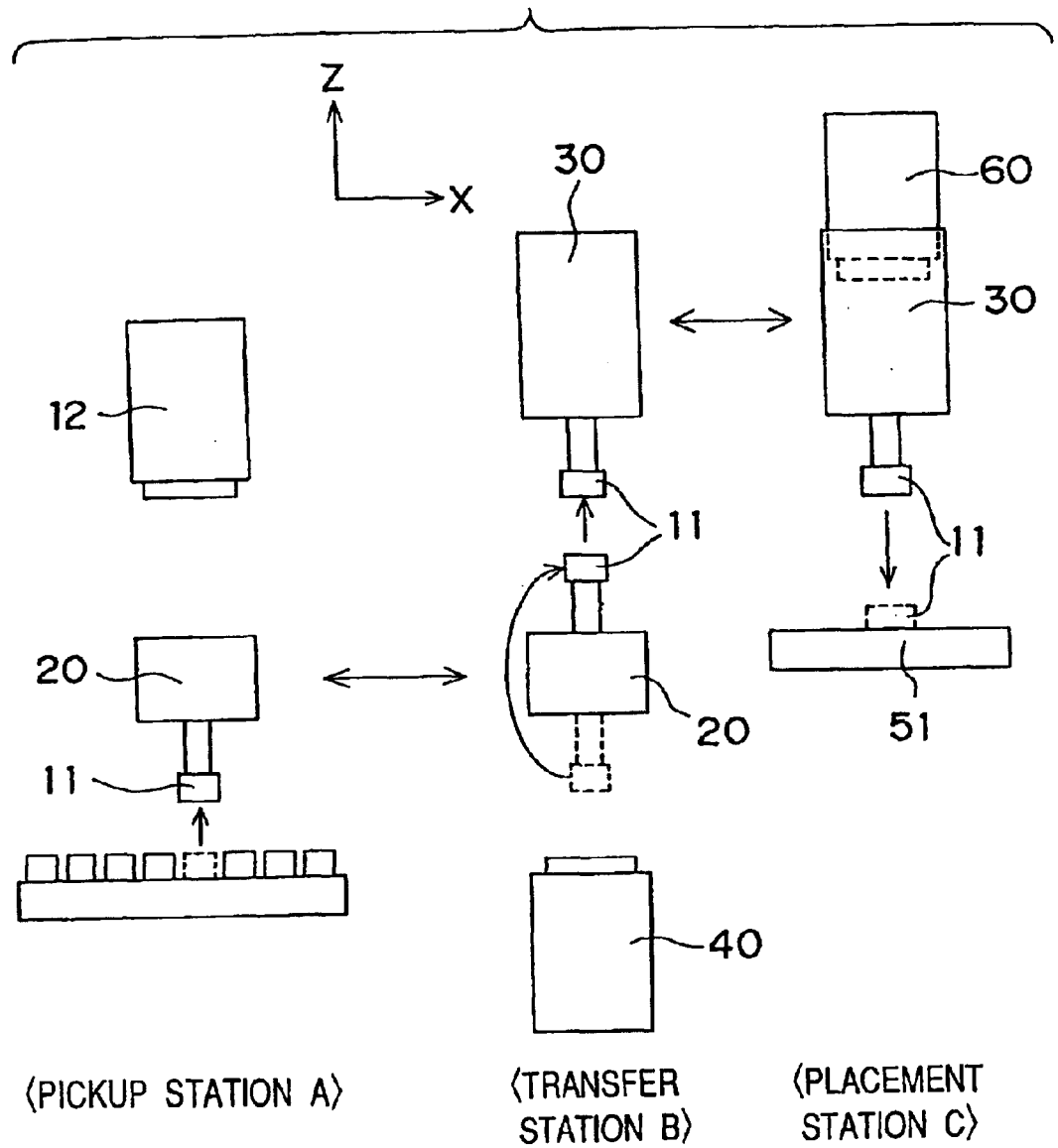

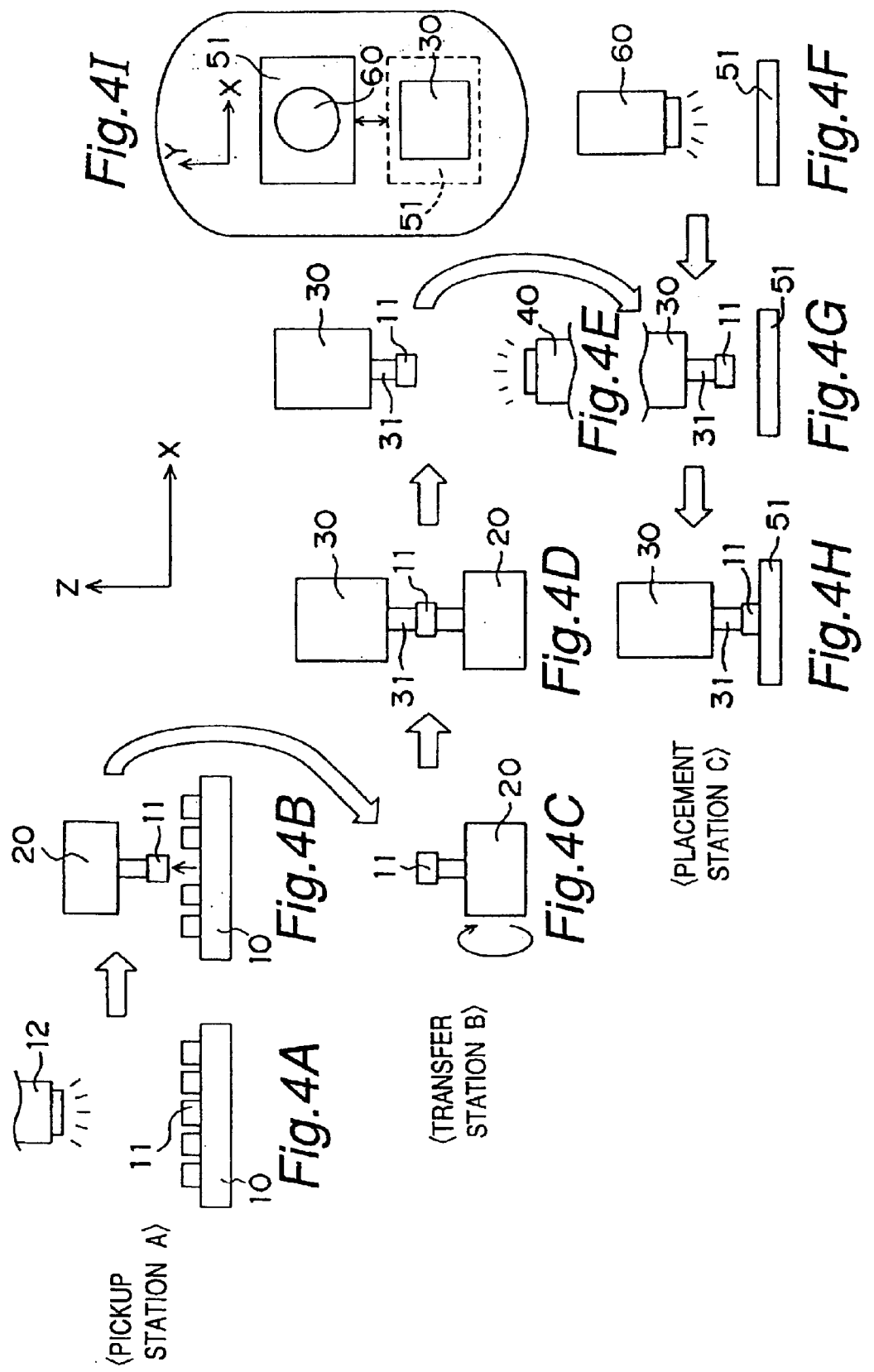

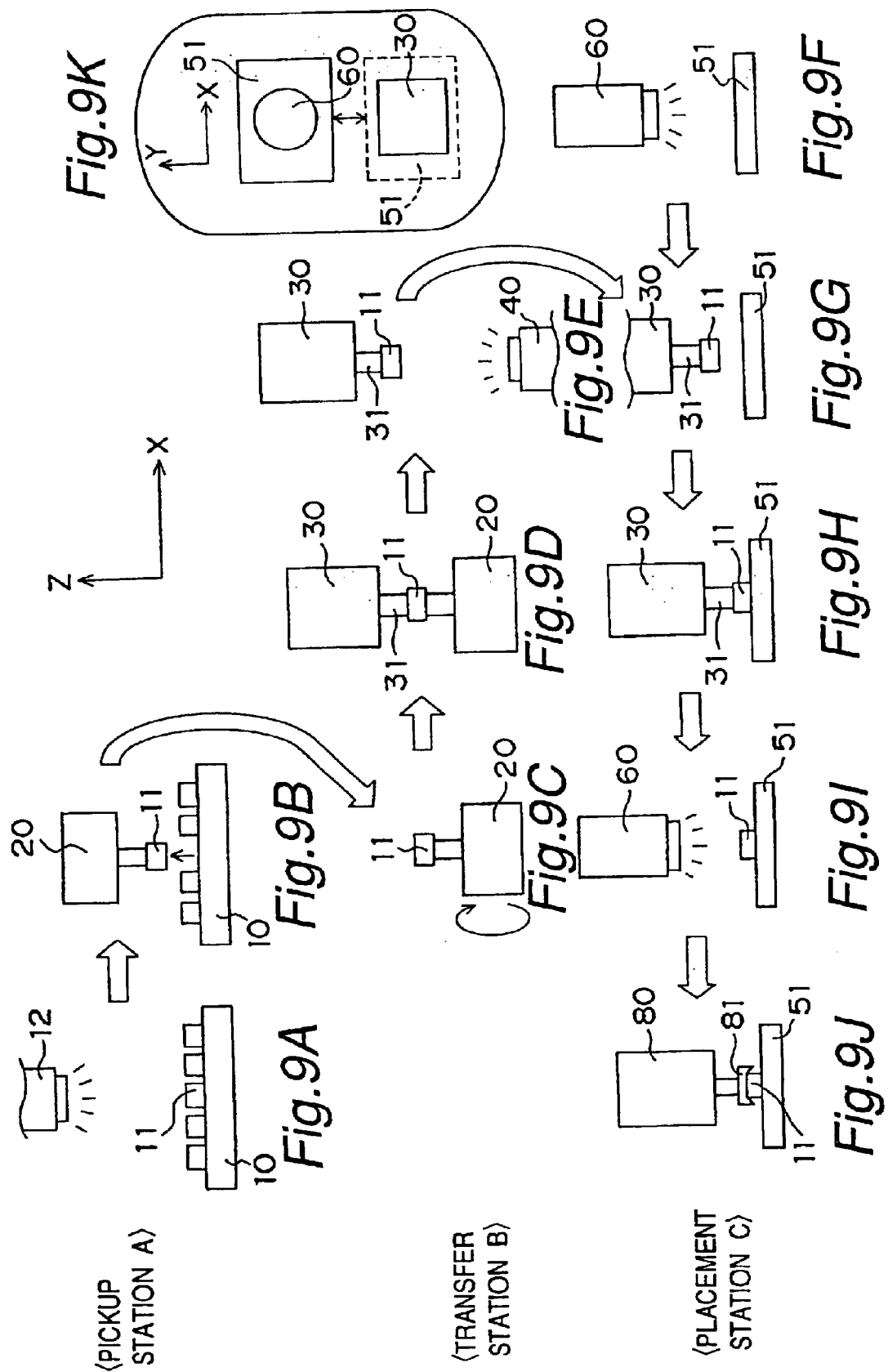

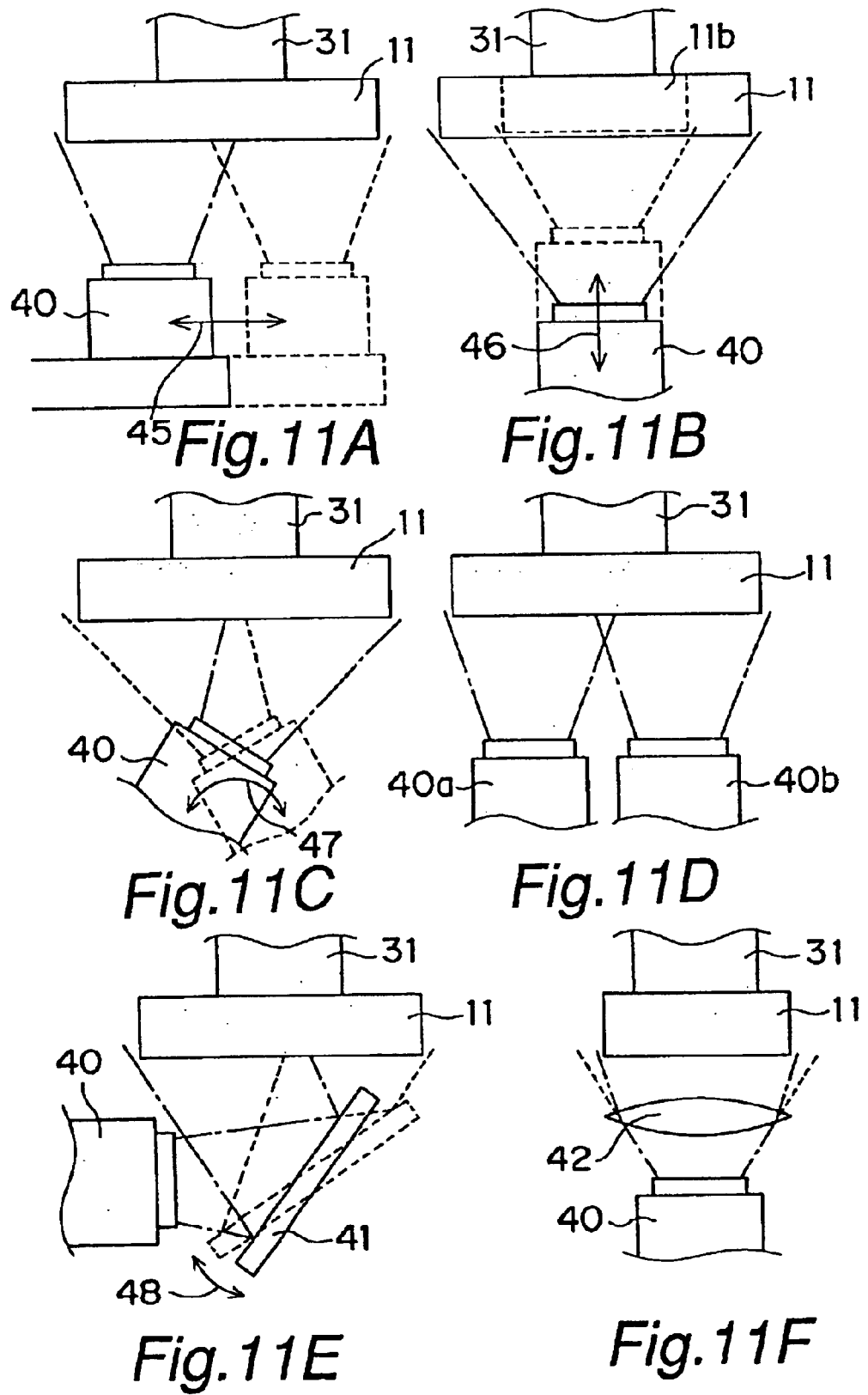

APPARATUS AND METHOD FOR MOUNTING COMPONENT

TECHNICAL FIELD OF THE INVENTION

The present invention relates to an apparatus and method for mounting components, such as electric devices, onto a substrate or circuit board.

BACKGROUND OF THE INVENTION

Generally, a component mounting apparatus has been used widely for sequential positioning or mounting of electric components onto a substrate such as a printed circuit board. FIG. 12 shows a conventional component mounting system. The system generally indicated by reference numeral 100 includes a component supply 110 for supplying components; a transport head 120 for picking up one of the components from the component supply 110 and then turning the component upside down to orient the component in a predetermined mounting direction; a placement head 130 for receiving the component from the transport head 120 and then placing the component onto the substrate or printed circuit board in place; an imaging camera 140 for capturing an image of the component received by the placement head 130; a holder 150 for holding and then positioning the circuit board in place in the system 100; another imaging camera 160 for capturing an indication marked on the circuit board; and a controller 170 for controlling an entire operation of the system 100. The placement head 130, which is supported to move horizontally in an X-direction in FIG. 12, is equipped with a vacuum nozzle or quill capable of rotating about a vertical Z-axis.

Referring to FIGS. 13 and 14 operations of the system will be described hereinafter. In these figures, the component supply 110 is provided with a number of components 111 supported and separated from another on an expanded plate 112. The components 111 are each recognized by an imaging device or camera 113. Based upon this recognition, the controller 170 moves the component supply 110 so that one component 111a to be mounted during a subsequent mounting is positioned in a predetermined pickup position. The transport head 120 travels to a position right above the component 111a, moves downward to contact the component 111a, and then sucks the component 111a for unloading. After unloading, the transport head 120 moves upward and then travels in the X-direction to a transfer station. At the transfer station, the transport head 120 together with the component turns upside down as indicated by arrow 121. This brings the component 111a from an upside-down position into an upright position so that one surface (i.e., bottom surface with solder bumps or electrical connections) to be opposed to the circuit board is faced downwardly. The placement head 130 approaches the component 111a in the upright position from above to receive the component from the transport head 120. Then, the placement head 130 moves upward and then travels in the X-direction toward a placement station. The transport head 120, after being deprived of the component, moves back to the pickup station for a subsequent pickup operation During the operation described above, a circuit board 151 is transported to and then held in position by the holder 150. The imaging device or camera 160 approaches the circuit board 151 to capture an indication defined on the circuit board, indicative of a reference position for mounting of the component. This captured image is then transmitted to the controller 170.

As best shown in FIG. 13, the imaging device 160 together with another imaging device 140 is mounted on an optical head 180. After recognition of the indication on the circuit board 151, the optical head 180 moves back in the X-direction toward the placement head 130 that is running in an opposite direction. Once opposed, not only the optical head 180 but also the placement head 130 comes to a halt. In this state, the component 111a held by the placement head 130 is recognized by the imaging device 140. An image captured by the imaging device 140 is transmitted to the controller 170. At this moment, a sucking nozzle of the placement head 130 for sucking and holding the component 111a is maintained in an elevated position. This prevents the nozzle from causing a conflict with the imaging device 140. Also, this sucked component 111a is held within a field of the imaging device 140.

After completion of this recognition, the placement head 130 with the component 111a restarts traveling in the X-direction again toward the mounting station. During this travel, recognition results of the component 111a and the circuit board 151 (in particular, the reference indication) are used for calculations performed in the controller 170. The controller 170 calculates displacement in the X-direction of the placement head 130 for mounting of the component 111a onto a predetermined position of the circuit board 151. Also calculated in the controller 170 are a rotational angle of the nozzle about a Z-axis and displacement of the circuit board 151. According to these calculations made by the controller 170, the placement head 130 travels in the X-direction to a position where it opposes the circuit board 151. At this moment, corrections for the nozzle and the circuit board 151 have already been completed. Then, the placement head 130 causes the nozzle to move downward, so that the component 111a is mounted in position on the circuit board 151.

After mounting, the placement head 130 releases the component 111a and then pulls up the nozzle in the Z-direction to a certain level. Then, the imaging head 180 moves in between the circuit board 151 and the placement head 130 so that the imaging device 160 determines whether the component 111a takes a predetermined position on the circuit board 151. Another imaging device 140, on the other hand, recognizes whether the placement head 130, in particular a tip end of the nozzle, carries any debris. Once this recognition has been completed, the placement head 130 moves back in the X-direction for receiving a next component. By repetition of the series of operations described above, the components on the expanded plate 112 are mounted sequentially on respective circuit boards with a cycle time of about, for example, 1.9 seconds.

However, the conventional component mounting system has several drawbacks in terms of its recognition operations. For example, for recognition of the component, the placement head 130, after it has received the component 111a, is accelerated to a certain velocity. Immediately after this acceleration, the placement head 130 comes to a temporal halt for recognition of the component 111a by the imaging device 160. This requires further acceleration and deceleration of the placement head 130 before actual mounting of the component 111a. Also, the placement head 130, after it has come to a halt, continues to vibrate for a certain period, which requires the imaging device 160 to wait until termination of the vibration in order to attain precise recognition of the component 111a. This in turn reduces an operational efficiency of the mounting.

Further, as shown in FIG. 14, in an operation for recognition of the circuit board 151, nozzle 131 of the placement head 130 is moved upward to the elevated position as indicated by arrow 135. Then, as indicated by arrow 145, the optical head 180 moves in between this elevated nozzle 131 and the circuit board 151 for imaging by the imaging devices 140 and 160. A distance between the elevated nozzle and the circuit board, indicated by letter H, is designed to be about 40 mm, for example, in order to prevent interference of the optical head 180 with the nozzle 131, and also to ensure a proper imaging operation of the optical head 180. Elevation of the nozzle 131 requires 0.1 seconds even by use of a high-speed voice coil motor.

Furthermore, the conventional mounting system is equipped with an interlock to avoid interference of the optical head 180 with the placement head 130 during recognition operations by the optical head 180 before and after mounting. This complicates structure of the mounting system 100 and makes the system less economical.

Moreover, a conventional recognition procedure requires the placement head 130 and the optical head 180 to travel along complicated passes, respectively. This in turn requires the mounting system to have a greater number of drive shafts and acceleration/deceleration operations, which further reduces positional precision of a moving part and thereby imaging quality.

SUMMARY OF THE INVENTION

Accordingly, an object of the present invention is to provide an improved component mounting apparatus and method.

To this end, the component mounting apparatus of the present invention has a component supply provided at a first station for supplying a component; a transport head for picking up the component at the first station from the component supply and then transporting the component to a second station; a placement head for receiving the component from the transport head at the second station and then transporting the component to a third station; a substrate provided at the third station, the substrate being provided with the component from the placement head at the third station; and an imaging unit for recognizing the component when held by the placement head; wherein the first imaging unit is positioned in or in the vicinity of the second station.

Another component mounting apparatus of the present invention has a component supply provided at a first station for supplying a component; a transport head for picking up the component at the first station from the component supply and then transporting the component to a second station; a placement head for receiving the component from the transport head at the second station and then transporting the component to a third station; a substrate holder for holding a substrate, the substrate holder being movable between the third station and a fourth station spaced a certain distance away from the third station; a first imaging unit for recognizing the component when held by the placement head; and a second imaging unit positioned at the fourth station for recognizing the substrate.

Another component mounting apparatus of the present invention has a component supply provided at a first station for supplying a component; a transport head for picking up the component at the first station from the component supply and then transporting the component to a second station; a placement head for receiving the component from the transport head at the second station and then transporting the component to a third station; a substrate holder provided at the third station for holding a substrate, the substrate being provided with the component from the placement head at the third station; a first imaging unit for recognizing the component when held by the placement head; and a second imaging unit for recognizing the substrate; wherein the first and second imaging units are arranged so as not to interfere with a passage of the placement head.

Also, a component mounting method comprises: picking up a component by a transport head from a component supply at a first station; transporting the component from the first station to a second station by the transport head; transferring the component from the transport head to a placement head at the second station; recognizing the component received by the placement head at or in the vicinity of the second station; transporting the component from the second station to a third station by the placement head; placing the component onto a substrate at the third station by the placement head; and controlling the step of placing the component onto the substrate based upon information obtained by recognition of the component.

BRIEF DESCRIPTION OF THE DRAWINGS

FIG. 3 is a side elevational view showing movement of elements in the component mounting apparatus shown in FIG. 1;

FIGS. 4A through 4I are side elevational views each showing movement of elements in the component mounting apparatus shown in FIG. 1;

FIGS. 9A through 9K are side elevational views each showing movement of elements in the component mounting apparatus shown in FIG. 8;

FIGS. 11A through 11F are side elevational views of a component recognizing device according to other preferred embodiments of the present invention;

DETAILED DESCRIPTION OF THE PREFERRED EMBODIMENTS

With reference to the drawings, a variety of embodiments of a component mounting system and its method according to the present invention will be described in detail hereinafter. It should be noted that although a vacuum nozzle is used for holding a component, and a circuit board is employed for a substrate to which the component is mounted, the present invention is not limited thereto. For example, the vacuum nozzle may be replaced by another mechanical holder or chuck for holding the component by mechanical engagement with the component. Also, the substrate may be another device or housing to which the component is mounted.

Figure 1:
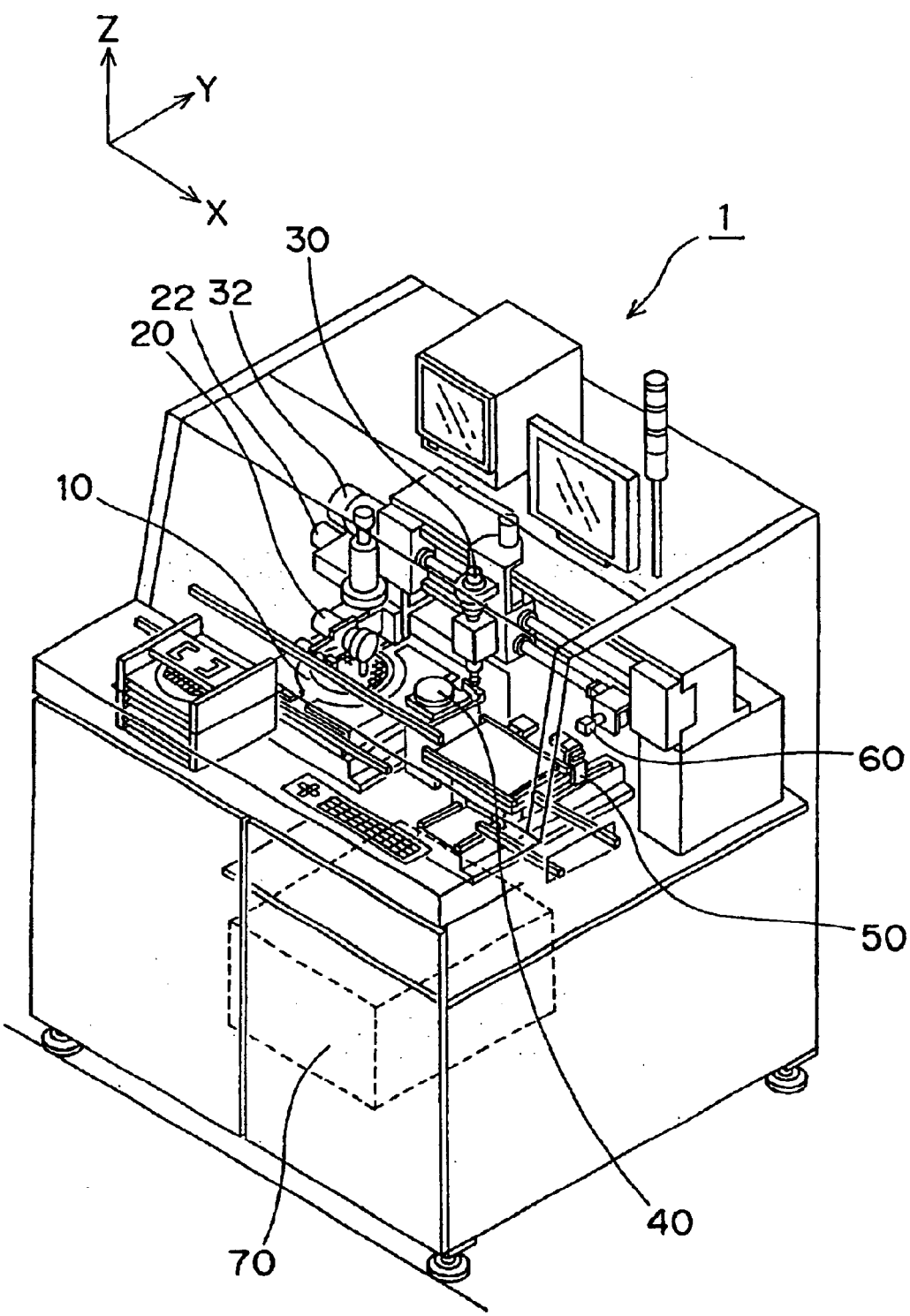
FIG. 1 is a perspective view of a component mounting apparatus according to a preferred embodiment of the present invention.

Referring to FIG. 1, there is shown an embodiment of the component mounting system, generally indicated by reference numeral 1, according to the present invention. Generally, the system 1 has a component supply 10 for supplying components to the system 1; a transport head 20 for picking up each component from the component supply 10 and then turning upside down to orient the component in a direction along which the component is mounted onto a substrate; a placement head 30 for receiving the component from the transport head 20 and then mounting the component onto the substrate; an imaging device or camera 40 for imaging a position of the component held by the placement head 30 immediately after the component has been transferred to the placement head 30; a substrate holder 50 for holding and then positioning the substrate in place in the system 1; another imaging device or camera 60 for imaging a position of the substrate; and a controller 70 for controlling an entire operation of the system 1.

Figure 2:
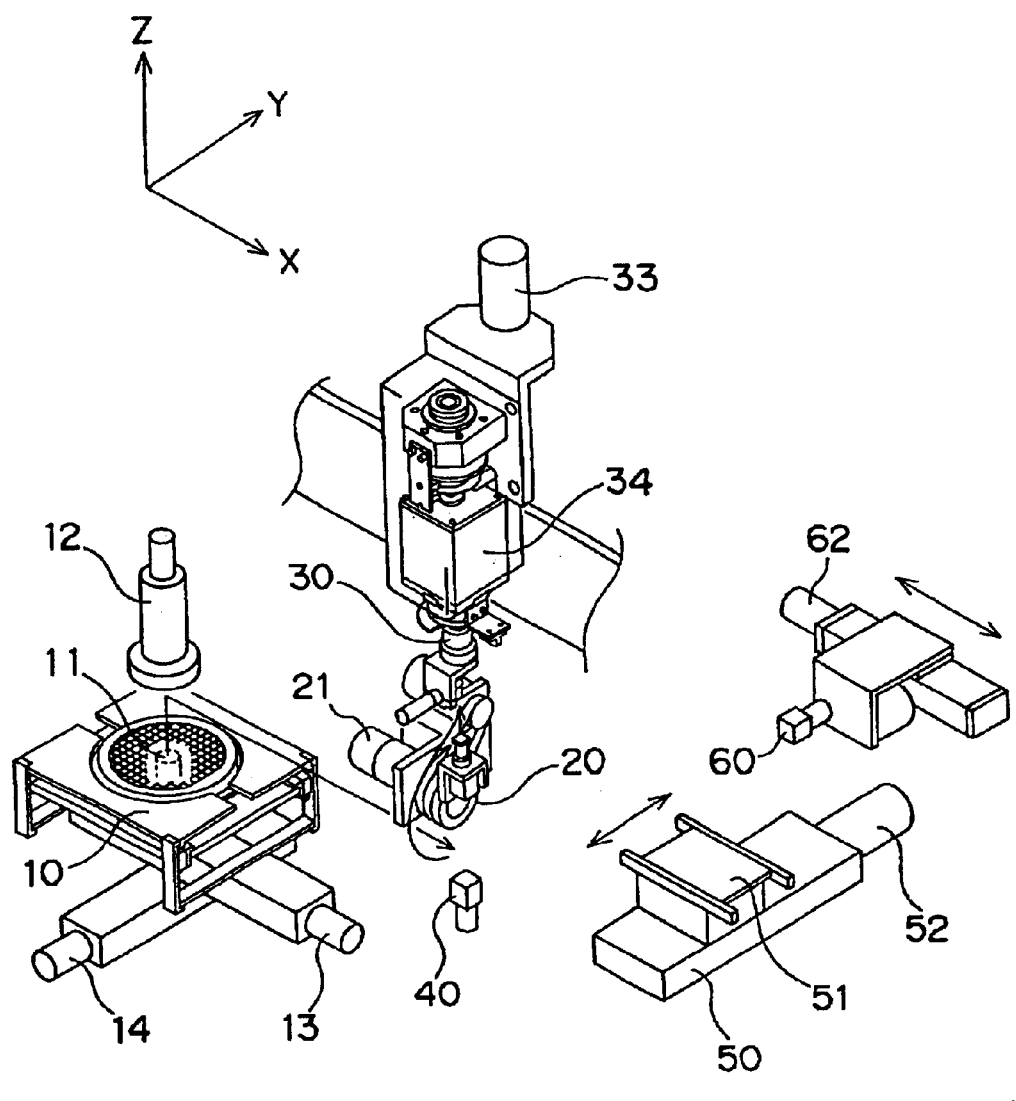
FIG. 2 is an exploded perspective view of various elements of the component mounting apparatus shown in FIG. 1.

Referring to FIGS. 1 and 2, the transport head 20 is supported by a horizontal guide (not shown) extending in an X-direction and is connected with a motor 22 so that by driving of the motor 22 the head 20 moves back and forth in the X-direction. The placement head 30 is also supported by a horizontal guide (not shown) extending in the X-direction and is connected with a motor 32 so that by driving of the motor 32 the head 30 moves back and forth in the X-direction.

Figure 14:
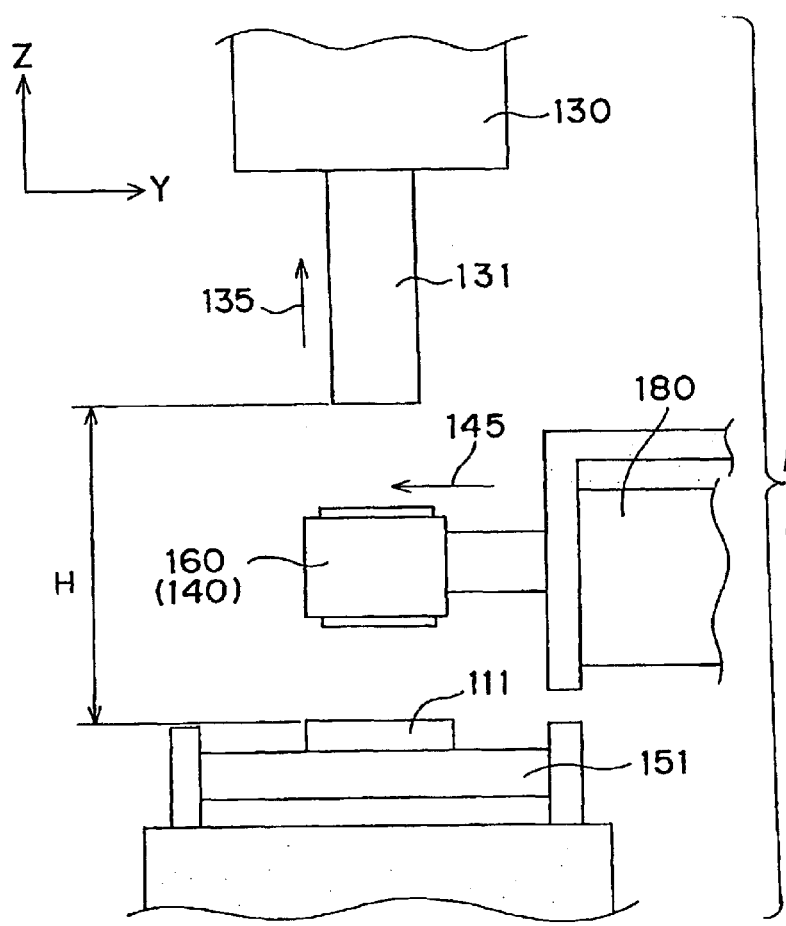
FIG. 14 is a side elevational view of movable elements in the conventional component mounting apparatus shown in FIG. 12.

As can be seen clearly by comparison of FIGS. 2 and 14, in the component mounting system 1 of the present invention, the imaging cameras 40 and 60 are located in different positions. For example, the imaging camera 40 is mounted adjacent a transfer station where the transport head 20 transfers the component to the placement head 30. The imaging camera 60, on the other hand, is mounted on a rear side of and outside a region where the placement head 30 travels in the X-direction so that the imaging camera 60 does not interfere with the placement head 30.

Referring again to FIGS. 1 and 2, the component supply 10 has an upper table, i.e., X-table (not shown), for supporting components and a lower table, i.e., Y-table (also not shown), for supporting the X-table. The tables are mounted so that the lower table moves back and forth in a Y-direction relative to the system and the upper table moves back and forth in the X-direction relative to the lower table. For this purpose, the tables are drivingly connected with respective motors 13 and 14, so that by driving of the motors 13 and 14 the tables move back and forth in the X- and Y-directions independently, thereby allowing a designated component to take a predetermined pickup position.

The transport head 20 is supported by the horizontal guide (not shown) extending in the X-direction and is connected with the motor 22 so that by driving of the motor the head 20 moves back and forth in the X-direction. A motor 21 is mounted on the transport head 20 for turning a picked component upside down, thereby allowing the component to be transported for the placement head 30 in a condition where a connecting portion of the component is faced downwardly.

The placement head 30 is slidably supported by the horizontal guide (not shown) extending in the X-direction and is connected with the motor 32 so that by driving of the motor 32 the head 30 moves back and forth in the X-direction. A motor 33 is mounted on the placement head 30 for rotating the component about a vertical Z-axis and thereby orienting the component in a predetermined direction. Another motor 34 is provided in the placement head 30 for vertical movement of a component holding part of the placement head 30.

The substrate holder 50, which is slidably supported by a guide rail (not shown) extending in the Y-direction, includes a motor 52 for its movement in the Y-direction along the guide rail. The imaging device 60, which is also slidably supported by a guide rail (not shown) extending in the X-direction, has a motor 62 for its movement in the X-direction along the guide rail. As described above, the component imaging device 40 is fixed in the system 1 at a position where it can oppose the placement head 30.

FIG. 3 shows a positional relationship of various parts and stations (i.e., pickup station A, transfer station B, and mount station C) in the system. As can be seen from this figure, each component supported on the component supply 10 is picked up by the transport head 20 at the pickup station A. The transport head 20 moves in the X-direction (from left to right in the figure) to the transfer station B where it turns upside down to overturn the component into a state in which the component can be mounted on the substrate from above. This overturned component 11 is then transferred to the placement head 30. The placement head 30 with the component 11 moves to the placement station C to mount the component 11 onto a predetermined position of the substrate 51.

In order to control sequential operations without any trouble, an imaging device or camera 12 is arranged at the pickup station A. The imaging devices 40 and 60 are arranged at the transfer and placement stations B and C, respectively. Also, the imaging devices 12, 40, and 60 are connected to the controller 70 (see FIG. 1) so that images captured by the imaging devices are transmitted to the controller 70, respectively. As already described above, the imaging device 60 is positioned on the rear side of the placement head 30 to avoid interference between the imaging device 60 and the placement head 30.

Referring next to FIGS. 4A to 4H, operations performed at respective stations will be described in detail hereinafter. These drawings illustrate operations performed at the stations A to C, when viewed in the Y-direction. As can be seen from these figures, operations performed at the pickup station A are depicted in FIGS. 4A and 4B, operations performed at the transfer station B are depicted in FIGS. 4C to 4E, and operations performed at the placement station C are depicted in FIGS. 4F to 4H.

At the pickup station A, as best shown in FIG. 4A, each of the components 11 supported by the component supply 10 is recognized by the imaging device 12 from above. By use of information transmitted from the imaging device 12, the controller 70 moves the component supply 10 so that the component 11 to be picked up and then mounted onto the substrate 51 takes a pickup position. Then, as shown in FIG. 4B, the transport head 20 reaches above the pickup position and then moves downward to pick up the component at the pickup position. Thereafter, the transport head 20 moves upward and then travels toward the transfer station B, i.e., from left to right in this figure. At this moment, the imaging device 12 is located above a pass of the transport head 20 so that no interference results therebetween.

Referring to FIG. 4C, at the transfer station B, the transport head 20 turns upside down so that the component is oriented into a placement condition. This allows for electric connections such as solder bumps provided at a bottom surface of the component to be directed downward for mounting onto the substrate. Although solder bumps are widely used for the electrical connections between the component and wires on a circuit board for mounting of, for example, an oscillator, the electrical connections can be performed by use of a conductive adhesive. Also in this placement condition, a top surface of the component, typically without any bump, is easy to be received or sucked by a vacuum nozzle of the placement head 30.

Although a turning operation of the transport head 20 is performed at the transfer station B in this embodiment, it can be done as the transport head 20 moves from the pickup station A to the transfer station B.

Also, although transfer of the component is performed vertically from the transport head 20 to the placement head 30, it can be done in any direction such as horizontally or obliquely.

At the transfer station B, the vacuum nozzle of the placement head 30 moves down toward the transport head 20 positioned below the placement head 30 to contact and then suck the component 11. Simultaneously with this, the transport head 20 releases the component 11, causing the component 11 to be transferred to the placement head 30.

After transfer of the component 11, the transport head 20 moves away from the transfer station B toward the pickup station A (i.e., from right to left in the figure) for a subsequent pickup operation of another component 11. As shown in FIG. 4E, movement of the transport head 20 away from the transfer station B allows the component 11 held by the placement head 30 to fall within the field of the imaging device 40 located under the transfer station B. The imaging device 40 recognizes the component 11 held by the placement head 30. An image of the component is then transmitted to the controller 70 by which a position of the component 11, including X- and Y-lateral positions of its center, and its angular orientation, is determined.

During the above operations performed at the pickup and transfer stations A and B, the substrate 51 is transported from a substrate supply not shown into the placement station C and then held by the substrate holder 50. As shown in FIG. 4F, the substrate 51 is opposed to the imaging device 60 for capturing an image of the substrate to identify respective locations of indications marked on the substrate. For this purpose, as best shown in FIG. 4F, the substrate 51, as well as the substrate holder 50, is moved from the placement station C to an offset position, spaced rearwardly away from the station C. Mounted above the offset position is the imaging device 60 for picking up an image of the indications. After image pickup, the substrate holder 50 together with the substrate 51 is carried back to the placement station C, as shown by dotted lines in FIG. 4I.

It should be noted that the imaging device in the conventional system is designed to move in two directions, i.e., X- and Y-directions, which requires two feed mechanisms. However, the imaging device 60 of the present invention moves back and forth only in the X-direction. This means that one of the two feed mechanisms can be eliminated from the system, which is more economical and improves quality of recognition.

Also, according to the conventional system the imaging device is designed to move into an operational position in which it opposes the substrate. At this moment, in order to avoid possible interference between the imaging device and the placement head, the placement head as well as the vacuum nozzle should be moved up and away from the imaging device. This requires another waiting time for the placement head, which results in extension of overall mounting time.

According to the present invention, the placement head 30 occupies a certain region spaced away from that of the imaging device 60, which ensures that no interference occurs between them. This also allows the imaging device 60 to pick up images at any time, irrespective of a position of the placement head 30, thereby reducing a mounting time.

The controller 70 determines a positional deviation between a predetermined sucking point and an actual sucking point by the nozzle and an angular orientation of the component, by use of an image or signals transmitted from the imaging device 40. Also, the controller 70 determines a positional deviation between predetermined and actual positions of the indications on the substrate 51, by use of an image or signals transmitted from the imaging device 60. Taking account of these deviations, the controller 70 calculates a travelling distance to the placement station, a rotating angle of the nozzle 31 about the vertical Z-axis, and a displacement of the substrate 51 with respect to the Y-direction. Based upon this calculation, operations of the motors for moving the placement head 30 and the substrate 51 are controlled by the controller 70.

After transfer and recognition of the component at the transfer station B, the placement head 30 begins to move toward the placement station C (i.e., from left to right in the figure). Also, after correction of a positional deviation and angular orientation by the controller 70, the placement head 30 moves to the placement station C, as shown in FIG. 4G. Thereafter, as shown in FIG. 4H the placement head 30 places the component 11 in place on the substrate 51.

During this operation, the nozzle 31 sucking and holding the component moves down with the placement head 30 toward the substrate 51. Once the solder bumps provided on the bottom surface contact with the substrate 51, the placement head 30 forces the component 11 against the substrate 51. Simultaneously, the placement head 30 applies a high frequency vibration to the component 11, causing the solder bumps to be connected with the substrate. The vibration may be an ultrasonic wave generated by a piezoelectric device. For example, the ultrasonic wave has an amplitude of about 1 micron and a frequency of about 63,000 per minute. After completion of component mounting, the placement head 30 moves back to the transfer station B for subsequent mounting of another component.

The imaging device 40 picks up an image of the placement head 30 as the head is waiting for a next transfer operation to determine existence of debris. If debris is detected, the system suspends subsequent operations for removal of the debris, which would otherwise cause damage to component 11 or the nozzle 31. This operation can equally be applied to the transport head 20. In this instance, the imaging device 40 picks up an image of the nozzle of the transport head 20 to detect any debris on the nozzle. Preferably, this is performed as the placement head 30 is moving toward the placement station C. Further, at the placement station C, after a placement operation is preformed by the placement head 30, the substrate 51 may move rearward to a shifted position where it opposes the imaging device 60 for picking up an image of the substrate 51 and thereby determining whether the component 11 has been mounted in place on the substrate 51.

The imaging device 40 positioned at the transfer station B allows the component 11 to be recognized before the placement head 30 begins to move toward the placement station C, which ensures the placement head 30 to move continuously without any halt. A position of the imaging device 40 is not limited thereto. For example, the imaging device 40 may be positioned in the vicinity of the transfer station B or in another position spaced slightly away from a position where a component is transferred from the transport head 20 to the placement head 30. A reason why the imaging device 40 is placed at or immediately adjacent the transfer station is to avoid any loss of time which is caused in the conventional operation that requires the placement head to halt after it has reached a maximum speed during course of moving from the transfer station to the placement station for recognition of a component, and also requires the imaging device to wait until vibration caused by the halt comes to an end. In this regard, time loss can be reduced to some extent even when the placement head makes a halt before it reaches the maximum speed. Therefore, the terms "vicinity" and "spaced slightly" means a certain range in which the placement head is accelerated up to the maximum speed.

Figure 5A:
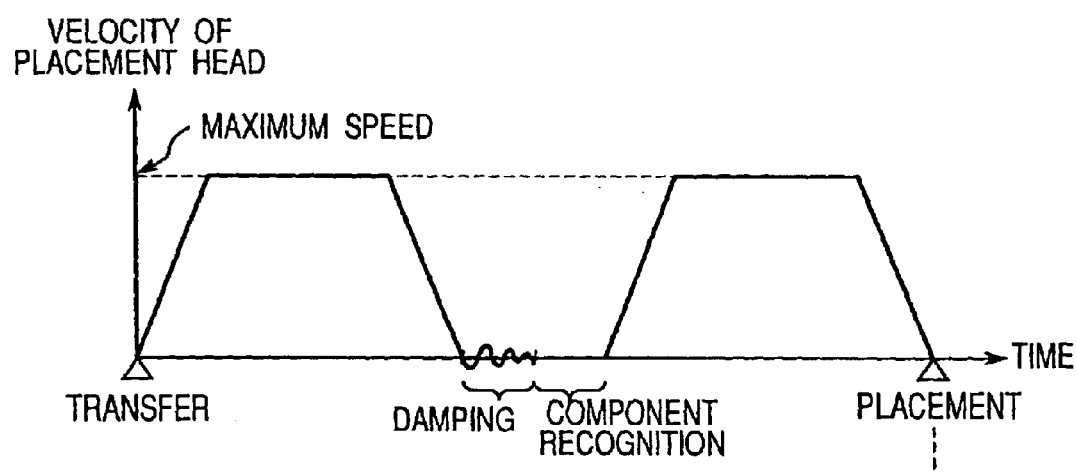
FIGS. 5A and 5B are graphs showing time versus moving velocity relationships of a placement head in a conventional system and a system according to the present invention.
Figure 5B:
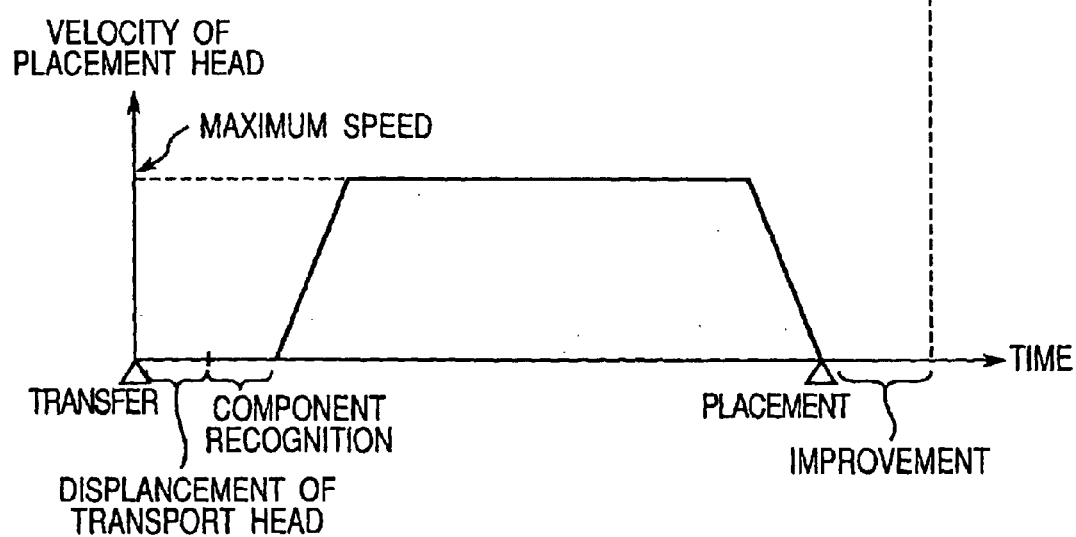

Referring to FIGS. 5A and 5B, descriptions will be made to this in detail. As shown in FIG. 5A, according to the conventional system in which the placement head halts during course of moving from the transfer station to the placement station for recognition of a component by the imaging device, a certain time of about 0.1 seconds is required for damping a vibration of the placement head caused by an inertial force of the placement head with a weight of about 10 kilograms, for example. After recognition, the placement head moves to the placement station, during which it is accelerated and then decelerated again.

Contrary to this, according to the mounting system of the present invention, as shown in FIG. 5B, after transfer of a component, the transport head 20 moves away from a field of the imaging device. Immediately after that, the component held by the placement head 30 is recognized. Then, the placement head 30 accelerates to a maximum speed, moves with this speed, and then decelerates to reach the placement station. This eliminates additional acceleration and deceleration required in the conventional system, which decreases a cycle time by about 0.2 seconds.

Figure 6:
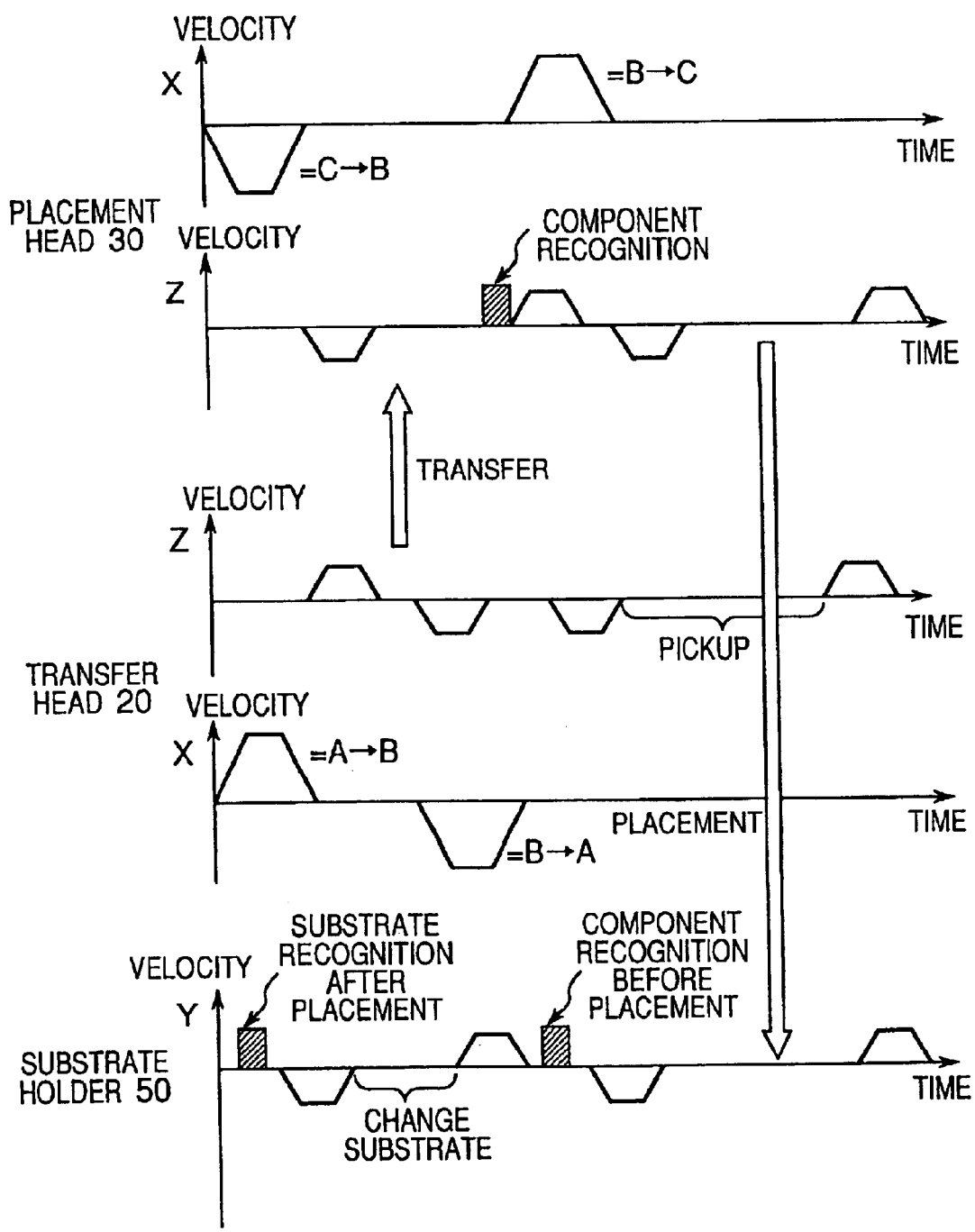
FIG. 6 is a graph showing time versus moving velocity relationships of transport and placement heads and a substrate holder together with a transport pass of a component.

FIG. 6 shows a relationship of movements and operations for the placement head 30, transport head 20, and substrate holder 50. As can be seen from this figure, after placement of a component, the placement head 30 moves back from the placement station C to the transfer station B. In synchronism with this, the transport head 20 which has already picked up a subsequent component moves from the pickup station A toward the transfer station B. The heads 20 and 30 halt to oppose each other at the transfer station B and then approach each other for transfer of the component from the transport head to the placement head, which is illustrated by a hollow arrow directed upwardly. Immediately after transfer of the component, the transport head moves back toward the pickup station, thereby allowing recognition of the component held on the placement head 30 by use of the imaging device. This recognition operation of the component is illustrated as a hatched box. When recognition is completed, the placement head 30 moves toward the placement station C. During movement of the placement head 30, a recognition operation for the substrate 51 is performed, which is illustrated as another hatched box. Then, the substrate holder 50 moves to the placement station C where the placement head 30 places the component on the substrate 51, which is illustrated by a hollow arrow directed downwardly. During this, the transport head 20 picks up a subsequent component from the component supply. The above-described operations are repeated for each component.

Provided below is a comparative table showing movement axes and mechanisms (i.e., feed mechanisms for X-, Y-, and/or Z-direction) for the transfer and placement heads, the imaging devices, and the substrate holder, required for the conventional system and the system of the present invention. It should be noted that an increase of the number of the feed mechanisms complicates structure of the system and also decreases positional precision of a component and devices such as head and substrate.

TABLE

| Element | Feed Mech. Required | | Improvement |
| --- | --- | --- | --- |
| | System 1 | System 100 | |
| Head 20 | X, Z | X, Z | Z-Displacement Reduced |
| Head 30 | X, Z | X, Z | Z-Displacement Reduced |
| Device 40 | X, Y | — [Y or Z] | No X,Y-Feed Mech. [No X-Feed Mech.] |
| Holder 50 | Y | Y | — |
| Device 60 | X, Y | X | No Y-Feed Mech. X-Displacement Reduced |

As can be seen from the table, with the system according to the present invention, the fixed imaging device 40 does not need X- and Y-feed mechanisms which are required for the conventional system. This not only simplifies a structure of the system but also increases positioning and imaging precision. Meanwhile, the imaging device 40 may be designed to move in Y- or Z-directions, which will be described below. Even in this embodiment, one of the two mechanisms is eliminated. This is illustrated in the table by bracketing.

For the imaging device 60, only one (i.e., X-feed) mechanism is needed. This means that one mechanism can be eliminated from the conventional system which needs two (X- and Y-) feed mechanisms. This is because the substrate 51 is shifted away from the placement station to another position for its recognition by the imaging device 60. Reduction of the feed mechanism also increases recognition precision of a substrate. Although the system is designed so that the substrate holder moves back and forth in the Y-direction, it may be moved in another direction provided that the substrate can be recognized by the imaging device in a certain position away from the placement station and the imaging device 60 does not cause any conflict with the placement head 30.

Further, the system of the present invention can shorten moving passes of respective moving elements. For example, according to the conventional system the vacuum nozzle 31 of the placement head 30 is required to move about 40 mm in the vertical direction in order to avoid interference with the imaging devices. Contrary to this, according to the system of the present invention, the imaging devices 40 and 60 are located at different positions and outside passage of the placement head 30 during movements in the X-direction. This minimizes vertical movements of the nozzle 31 in the placement head 30 at the transfer and placement stations down to about 1 mm, for example, which is required for prevention of interference with a component.

Further, according to the conventional system, the imaging device for substrate recognition is assembled with another imaging device for component recognition. This requires both imaging devices to move a long distance of about 250 mm, for example, between component and substrate recognition stations. However, according to the system of the present invention, the substrate recognition device is separated from other component recognition devices so that it is used only for recognition of the substrate. Therefore, the substrate recognition device is required to move only a limited distance of about 10 mm, for example, which might differ depending upon a size or purpose of a component. Reduction of a moving distance results in reduction of an inertial force of the movement mechanism as well as necessary rigidity of supporting structure, and also in an increase of precision of positioning.

As described above, the system 1 of the present invention has a number of moving parts. Among other things, the placement head 30 moves about 500 mm in the X direction between the transfer and placement stations B and C. Movement of each element should be controlled precisely in order to attain precise alignment of components on the substrate. For this purpose, the system employs servomotors, pulse-motors, and/or voice-coil motors for controlling a moving distance of the elements. In addition to those motors and in combination therewith, a linear scale may be used for each moving mechanism in order to attain a more precise control of the moving distance. The linear scale, which is a pulse encoder for measuring a linear displacement, has a reference scale with indices marked optically or magnetically and a detector mounted for movement on and relative to the reference scale, which ensures a precise movement control. Taking such feature into account, the linear scale is preferably used for compensation of a change of moving distance that might be caused by heat.

Figure 7:
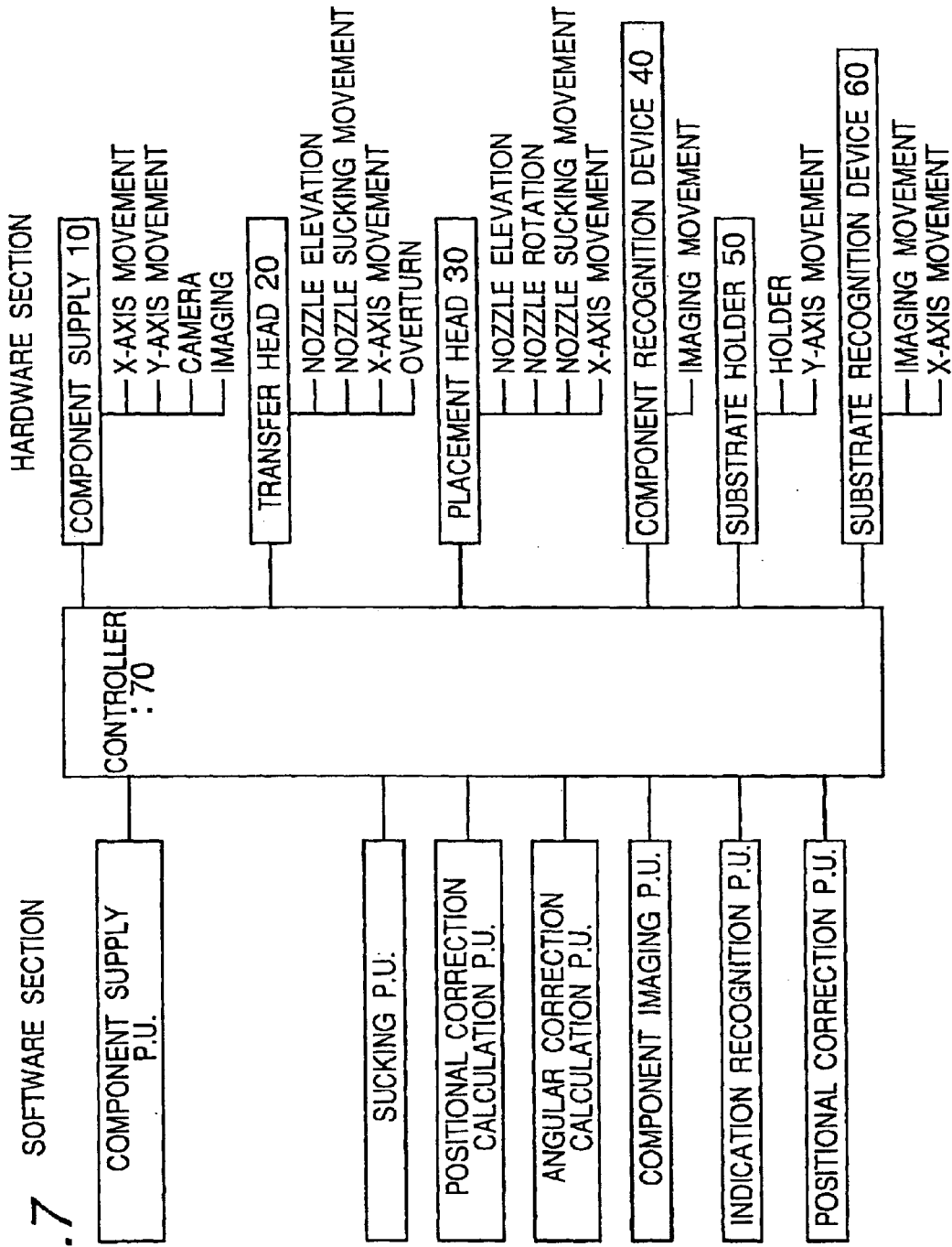
FIG. 7 is a block diagram of the component mounting apparatus according to the preferred embodiment of the present invention.

FIG. 7 is a circuit diagram showing various parts incorporated in respective devices described above. As can be seen from this figure, the system has a hardware section and a software section. The hardware section includes the component supply 10, transport head 20, placement head 30, component recognition device 40, substrate holder 50, and substrate recognition device 60. The software section includes various processing units for controlling necessary operations for supplying a component, sucking the component, calculating an amount for positional correction, calculating an amount for angular correction, recognizing the component, recognizing reference-indication, and correcting position. The hardware and software elements are integrated with the controller that controls overall operations of the elements.

Each of the hardware elements, whose operations are already described above, has various drivers connected through respective lines extending out from the elements. The controller receives signals from respective units of the software section and, based on which, controls respective drivers. Among other things, a component supply processing unit controls movement of the component supply 10 so that a component to be picked up is placed at the pickup position. A component sucking processing unit controls timing and vacuum for component sucking by nozzles mounted on the transfer and placement heads. Units for calculating positional and angular corrections calculate, from signals transmitted from the recognition device 40, a moving distance of the placement head 30 in the X-direction for mounting, and an amount of angular correction for the nozzle 31 about the vertical Z-axis. A component recognition unit controls recognition timing by the recognition device 40 and a field of the device. A reference-indication recognition unit controls recognition timing and a field of the substrate recognition device 60 and, based upon recognition by the device 60, a position correction unit controls a moving distance of substrate holder 50 in the Y-direction. With this arrangement, the recognition devices 40 and 60 are separated from each other, which allows respective devices 40 and 60 to be controlled independently, without any restriction imposed by the other device.

Figure 8:
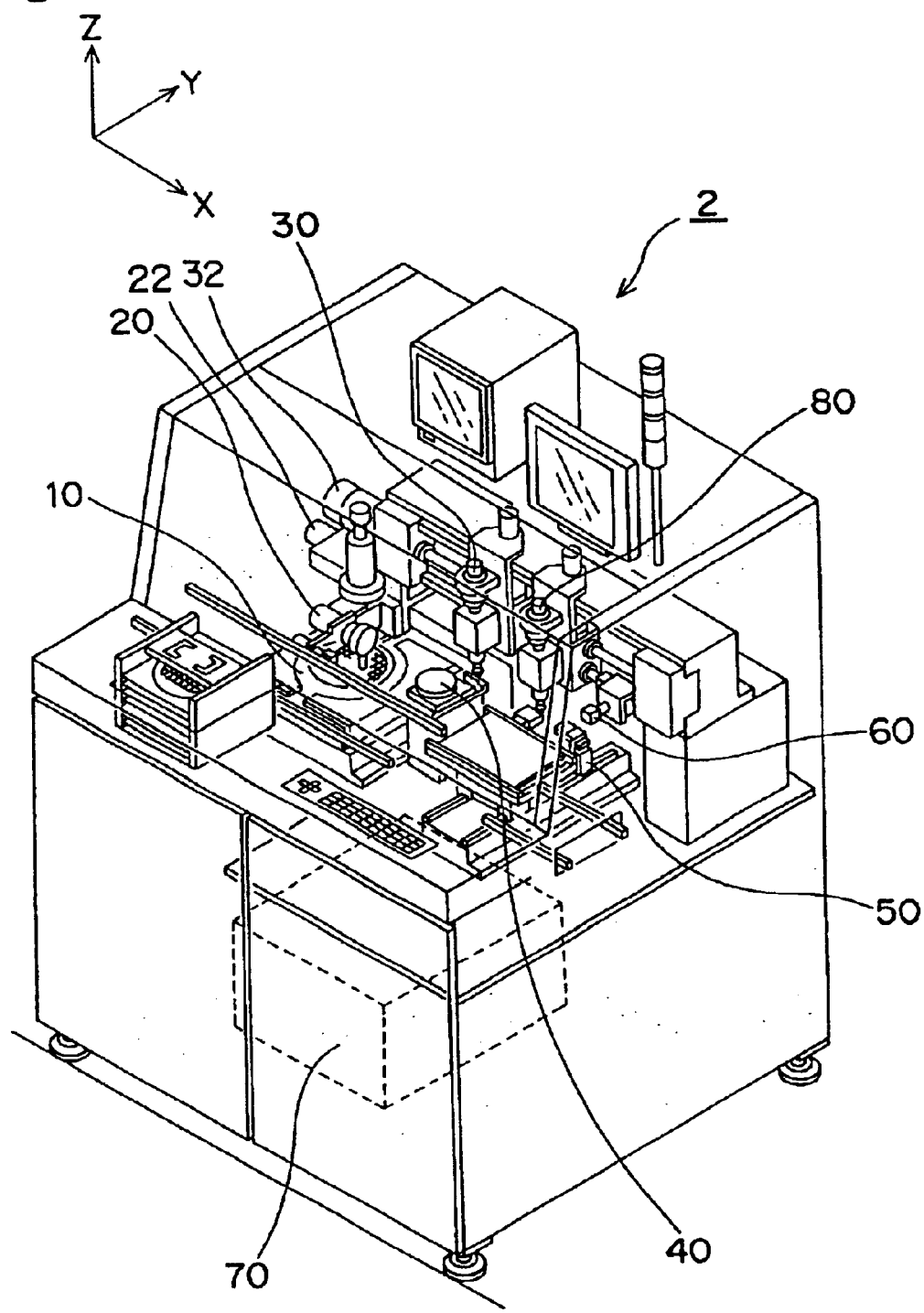
FIG. 8 is a perspective view of a component mounting apparatus according to another preferred embodiment of the present invention.

Referring to FIG. 8, another mounting system and method according to a second embodiment of the present invention will be described hereinafter. The component mounting system of this embodiment, generally indicated by reference numeral 2, is similar to that of the first embodiment except that the system 2 has a second placement head 80. Therefore, like parts bear like reference numerals throughout the drawings.

Meanwhile, according to the system of the first embodiment, the placement head 30 receives a component at the transfer station B and then moves to the placement station C for mounting of the component. The mounting of the component at the placement station C is completed by an ultrasonic connection, which needs a relatively extended period of time of about 0.5 seconds. This increases a waiting time of an associated element or elements, which results in an unwanted extension of an overall time for mounting.

Contrary to this, in the system 2 of this embodiment, the first and second placement heads bear respective functions and thereby enhance productivity of mounting. For example, the system 2 is designed so that the placement head 30 serves for a first step of mounting in which component 11 is mounted on substrate 51 and then connected temporally by ultrasonic vibration. This temporal connection requires only a limited time of about 0.1 seconds. After the temporal connection, the placement head 30 moves back from the placement station C to the transfer station B where it receives a next component from the transport head. The second placement head 80 serves for a second step of mounting in which it applies ultrasonic vibration again to temporally connected component 11 for permanent connection of the component to the substrate. The permanent connection requires another time of about 0.4 seconds.

With this two-step connection embodiment, the first (temporal) and second (permanent) connections by the placement heads 30 and 80 require about 0.1 and 0.4 seconds, respectively. Therefore, a total connection time appears to be identical to that required by the system 1 of the first embodiment. However, according to the system 2, after the temporal connection, i.e., during the permanent connection, the placement head 30 can proceed to receive the next component, which means that an overall time for mounting per component is substantially reduced by, for example, 0.4 seconds.

Therefore, functional separation using two placement heads causes an overall time for mounting of a component to be reduced considerably, and also causes productivity of the system to be increased significantly. Besides, this two-step connection provides a drastic increase of a connecting force of the component than does a one-step connection.

In order to provide the ultrasonic vibration to the component effectively, another holder in the form of bracket or box cover may be used for holding the component and then forcing it to the substrate.

Also, in the two-step connection, a position and/or orientation of a component mounted temporally on the substrate may be recognized by the recognition device and, if necessary, corrected at permanent connection based upon this recognition result. In this instance, immediately after the temporal connection of the component by the placement head 30, the substrate 51 is transported rearwardly to oppose fixed recognition device 60 for recognition of the component mounted temporally on the substrate. Then, based on positional information transmitted from the recognition device 60, controller 70 calculates an amount for X-, Y-, and/or angular correction and then controls movement of the other placement head 80.

Preferably, the recognition device 40 recognizes a component holding portion of the placement head 30 immediately after temporal mounting of the component, and also recognizes a component holding portion of another placement head 80 before permanent mounting of the component. This allows the controller 70 to prevent any possible accidents, which may be caused by existence of debris at the component holding portions of the placement heads. Also, this allows the placement head 80 to hold the temporally mounted component positively.

FIGS. 9A to 9J schematically show a series of operations performed at the pickup, transfer, and placement stations, by the system 2. As can be seen from these figures, the operations illustrated in FIGS. 9A to 9G are the same as those illustrated in and described with reference to FIGS. 4A to 4G.

According to the system 2 of this embodiment, in particular, the component 11 is temporally mounted on and connected with the substrate 51 as shown in FIG. 9H. After completion of temporal connection of the component, the placement head 30 moves back in the X-direction to the transfer station B for a transfer operation of a next component. After disengagement from the placement head 30, the substrate 51 moves rearwardly in the Y-direction to oppose the recognition device 60. As shown in FIG. 9I, the recognition device 60 recognizes the component temporally connected on the substrate 51 and then transmits a recognized image signal to the controller 70. A positional relationship between the substrate 51 and the recognition device 60 is similar to that shown in FIG. 9K. After this recognition, the substrate 51 moves back in the Y-direction to the placement station where it opposes the second placement head 80. As shown in FIG. 9J, the placement head 80 moves downward to hold the temporally connected component 11. Also, the placement head 80 forces the component 11 to the substrate and then provides the component with ultrasonic vibration for permanent connection of the component to the substrate.

As best shown in FIG. 9J, the component holding portion of the placement head 80 is defined in the form of bracket. Alternatively, the placement head takes another configuration suitable for positioning of a component and application of ultrasonic vibrations to the component.

It should be noted that when any misalignment, such as improper mounting or connection of a component, is detected by the recognition device 60 (see FIG. 9I), the controller 70 suspends a mounting operation to make a warning. In this case, if necessary, the substrate 51 may be discarded automatically or manually.

Figure 10A:
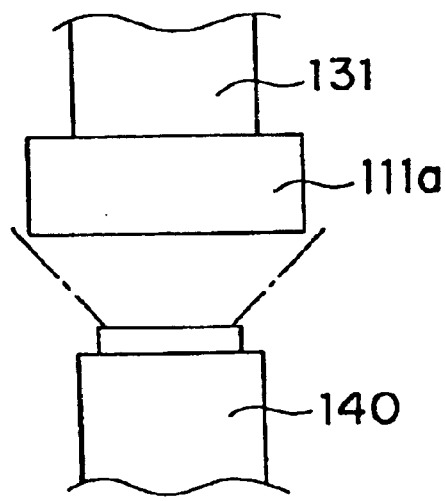
FIGS. 10A and 10B are side elevational views of an imaging device and a component in a conventional system and a system according to the present invention.
Figure 10B:
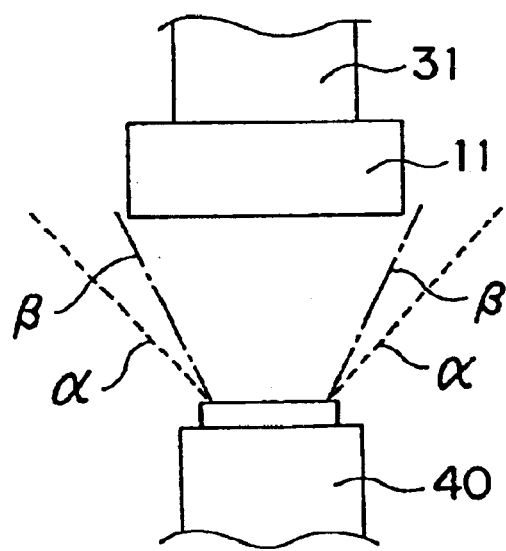
Figure 12:
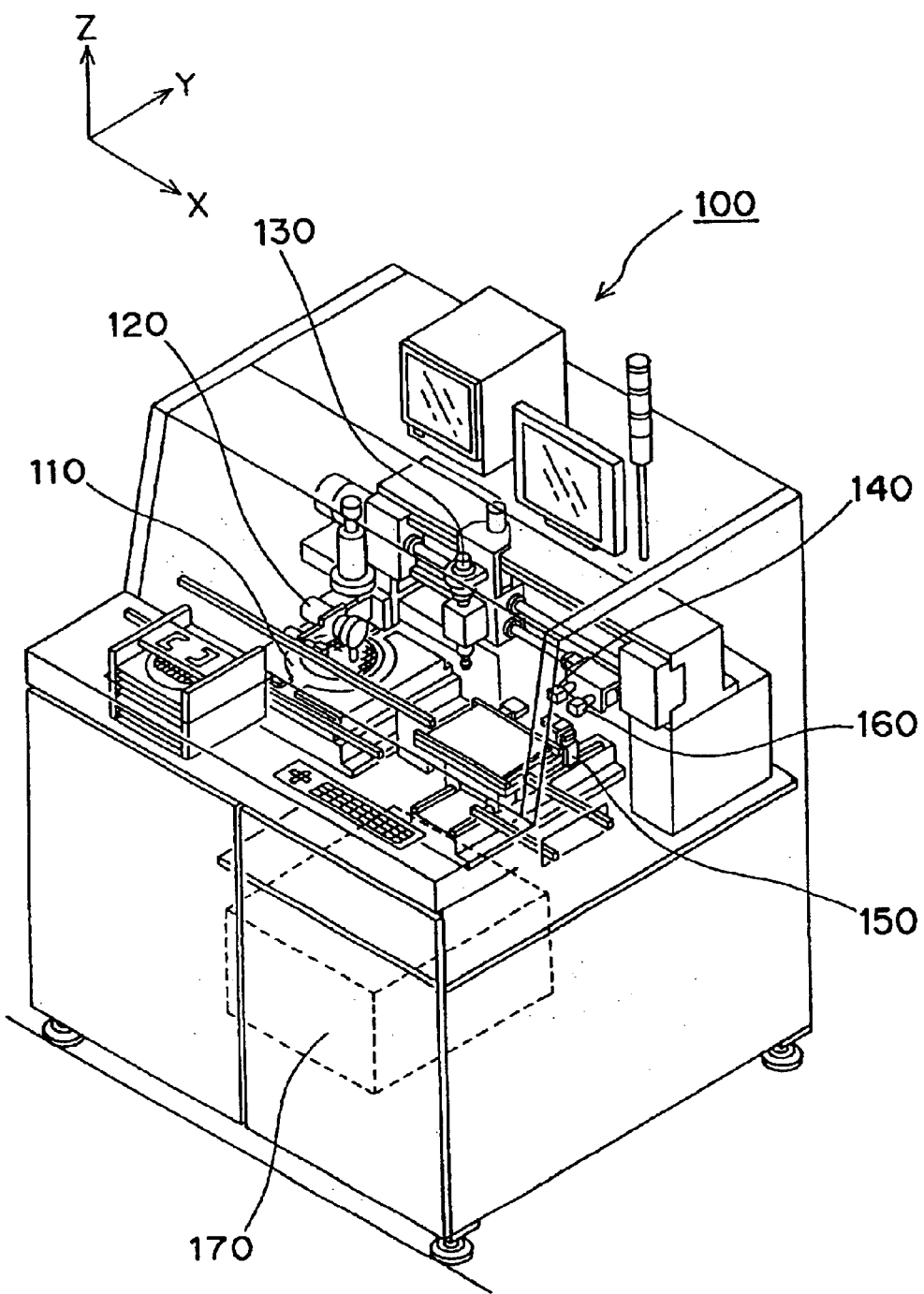
FIG. 12 is a schematic perspective view of a conventional component mounting apparatus.

Referring to FIGS. 10A and 10B, another embodiment of the system according to the present invention will be described hereinafter. These figures illustrate positional relationships between a component sucked and held by the nozzle 31 of the placement head 30, and the recognition devices in the conventional system (FIG. 10A), and the system of the present invention (FIG. 10B), respectively.

Figure 13:
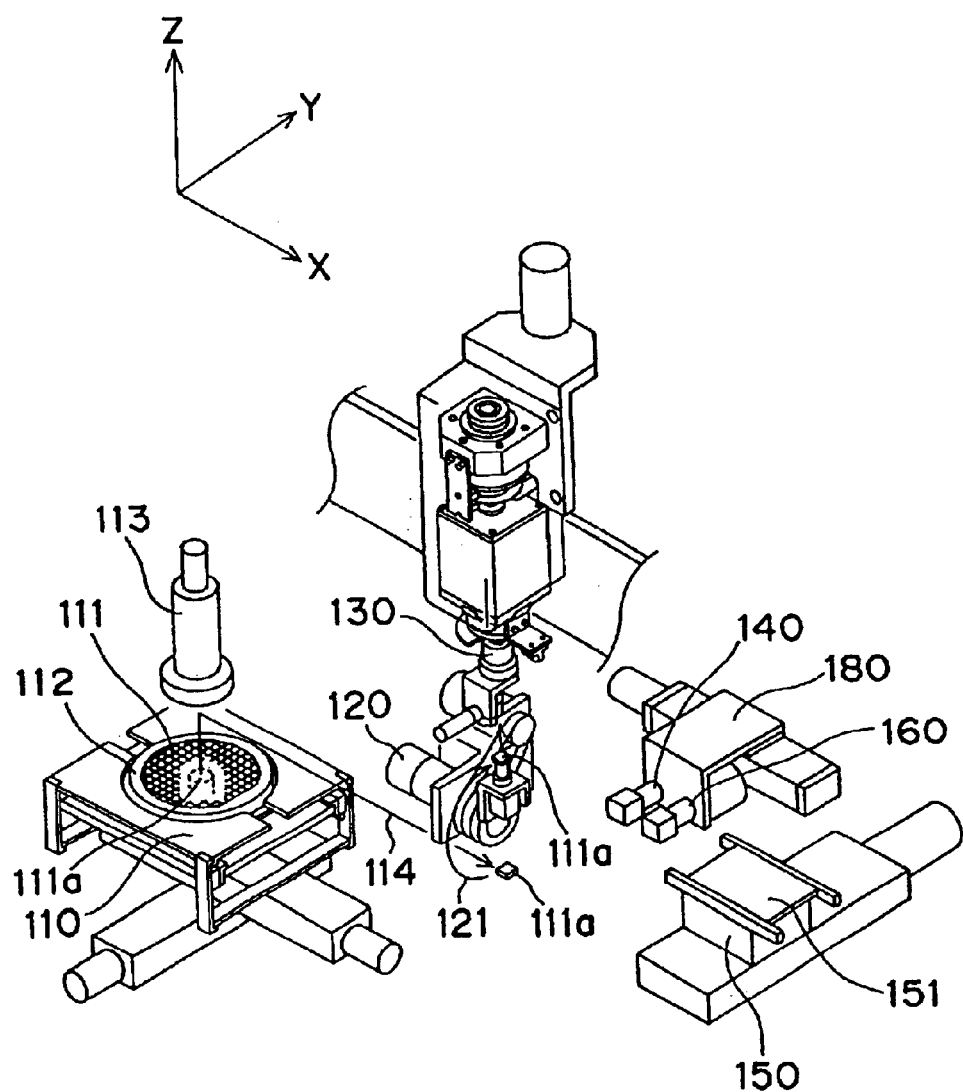
FIG. 13 is an exploded perspective view of various elements of the conventional component mounting apparatus shown in FIG. 12.

As described above with reference to FIGS. 13 and 14, according to the conventional system a space between component 111a held by nozzle 131 of placement head 130 and substrate 151 is so limited. This fails to ensure a distance, between recognition device 140 and the component, necessary for proper recognition of the component, which reduces resolution of an image of, in particular, a large-sized component. Contrary to this, the recognition device 40 is mounted only for recognition of a component and therefore fixed in the system, which does not need additional space to avoid interference with neighboring members. This in turn defines a larger space between the recognition device 40 and the component than in the conventional system, which increases a field and/or resolution of the recognition device 40. This increase of the field and resolution are illustrated by dotted lines a and long and short dotted lines β in FIG. 10B Improvement in the field and/or resolution of the recognition device can be attained by other embodiments illustrated in FIGS. 11A to 11F. For example, according to the embodiment in FIG. 11A, the recognition device 40 is designed to shift in the direction indicated by arrow 45, i.e., the X- or Y-direction, to a certain extent. With this arrangement, first the recognition device 40 occupies a first position where it recognizes a part of a component. Then, the recognition device 40 moves to a second position where it recognizes a remaining part of the component. Partial images of the component are then combined and processed at the controller for subsequent processes such as positional and/or angular correction of the component. This process allows the recognition device to capture an entire image of the component with a necessary resolution even within a limited space. This in turn means that a moving range of the recognition device for component recognition can be minimized. In addition, horizontal movement of the recognition device 40 may reduce a likelihood that it suffers from any damage by a possible dropping of a component or other members.

Although an entire image of the component is captured through two pickup processes, a greater amount of pickup processes can be employed for a larger component.

In another embodiment in FIG. 11B, the recognition device 40 is designed to move vertically, i.e., in the Z-direction between a lowered position indicated by solid lines and an elevated position indicated by dotted lines. This embodiment allows the recognition device 40 to shift its focus vertically so that components with different heights or at different levels can be recognized without any defocus. For example, as shown in this figure larger component 11 is moved down from the elevated to the lowered position to extend its field, so that an entire image of the larger component can be captured at once. The recognition device 40, due to its movability in the vertical direction, is also available for detection of debris carried by a component holding portion of the transfer and placement heads 20 and 30.

In another embodiment in FIG. 11C, the recognition device 40 is supported by a horizontal axis not shown so that it rotates as indicated by arrow 47. This arrangement allows the recognition device 40 to take a first position (indicated by solid lines) where it recognizes a part of a component, and a second position (indicated by dotted lines) where it recognizes a remaining part of the component. For this purpose, the recognition device is connected with a driving source such as a pulse motor that is controlled by the controller. The system may be designed so that the recognition device takes three positions where the recognition device captures respective parts of a component.

In another embodiment in FIG. 11D, the recognition unit has two fixed recognition devices 40a and 40b in order to enlarge a field of the recognition unit. This arrangement allows a larger component to be recognized by two recognition devices with a high resolution. Also, this arrangement may be used so that either one of the recognition devices works for a small component, and both for a large component. Of course, an amount of recognition devices is not limited to two.

In another embodiment in FIG. 11E, the recognition device 40 is oriented horizontally. Also, the recognition unit has a mirror 41. The mirror 41 is located in front of the recognition device 40 and supported for rotation so that a field of the recognition device is reflected and then moved across a component. With this arrangement, the mirror rotates between a first position where a reflected field of the recognition device covers a part of a component and a second position where a reflected field covers a remaining part of the component. For this purpose, the mirror is drivingly connected to a motor, such as a pulse motor, so that the controller controls the motor to rotate the mirror. The mirror may be any member capable of changing a light pass, such as a prism.

In another embodiment in FIG. 11F, the recognition unit has an optical member 42, such as a lens, positioned between the recognition device 40 and component 11, thereby allowing the recognition device 40 to pick up an image of a larger component. The optical member 42 may be supported to move out of a space between the recognition device 40 and the component 11. Two or more optical members may be prepared so that a suitable one of which is selected depending upon a size of a component and/or required resolution. Also, the optical member 42 may be used in combination with other optical elements such as a mirror and prism. Further, the recognition device 40 may be supported for movement not only in this embodiment but also in the previous embodiment in FIG. 11E, which enlarges a field of the recognition device while maintaining required resolution.

While this invention has been described in conjunction with a specific embodiment thereof, it is evident that many alternatives, modifications, and variations will be apparent to those skilled in the art. Accordingly, it is intended to embrace all such alternatives, modifications, and variations that fall within the spirit and scope of the appended claims.

What is claimed is:

1. A component mounting apparatus, comprising:
    a component supply provided at a first station for supplying a component;
    a transport head for picking up the component at said first station from said component supply and then transporting the component to a second station;
    a placement head for receiving the component from said transport head at said second station, after said transport head has turned the component upside down, and then transporting the component to a third station;
    a substrate holder provided at said third station for holding a substrate to be provided with the component from said placement head at said third station; and
    an imaging unit, positioned in or in the vicinity of said second station, for recognizing the component when held by said placement head.

2. The component mounting apparatus according to claim 1, wherein said imaging unit is fixed in or in the vicinity of said second station.

3. The component mounting apparatus according to claim 1, wherein said imaging unit is movable in a direction perpendicular to a direction along which said imaging unit opposes said placement head for recognition of the component.

4. The component mounting apparatus according to claim 1, wherein said imaging unit is movable in a direction along which said imaging unit opposes said placement head for recognition of the component.

5. The component mounting apparatus according to claim 1, wherein the vicinity of said second station is defined by a range in which said placement head is to accelerate up to a maximum speed during course of movement from said second station toward said third station.

6. The component mounting apparatus according to claim 1, wherein said imaging unit is supported so as to recognize different portions of the component.

7. The component mounting apparatus according to claim 1, wherein said imaging unit includes a plurality of imaging devices.

8. The component mounting apparatus according to claim 1, wherein said imaging unit includes an optical member for changing an optical feature of said imaging unit.

9. The component mounting apparatus according to claim 8, wherein said optical member comprises one of a mirror, prism and lens, or a combination thereof.

10. The component mounting apparatus according to claim 1, wherein said imaging unit is to recognize a portion of said transport head and/or a portion of said placement head, for holding the component.

* * * * *

UNITED STATES PATENT AND TRADEMARK OFFICE
CERTIFICATE OF CORRECTION

| | |
|---|---|
| PATENT NO. | : 7,020,953 B2 |
| APPLICATION NO. | : 10/239060 |
| DATED | : April 4, 2006 |
| INVENTOR(S) | : Yasuharu Ueno et al. |

It is certified that error appears in the above-identified patent and that said Letters Patent is hereby corrected as shown below:

On the Front Page
In Section (75), Inventors, please add --Takashi Shimizu, Osaka (JP)--.

Signed and Sealed this

Tenth Day of April, 2007

JON W. DUDAS
*Director of the United States Patent and Trademark Office*